US012628564B2

(12) United States Patent
Honda et al.

(10) Patent No.: US 12,628,564 B2
(45) Date of Patent: May 12, 2026

(54) CRYSTAL ELEMENT, CRYSTAL DEVICE, ELECTRONIC EQUIPMENT, AND METHOD FOR MANUFACTURING CRYSTAL ELEMENT

(71) Applicant: KYOCERA Corporation, Kyoto (JP)

(72) Inventors: Koki Honda, Kyoto (JP); Seiichiro Namikawa, Kyoto (JP); Shogo Nakagawa, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 1023 days.

(21) Appl. No.: 17/779,613

(22) PCT Filed: Nov. 25, 2020

(86) PCT No.: PCT/JP2020/043779
§ 371 (c)(1),
(2) Date: May 25, 2022

(87) PCT Pub. No.: WO2021/106921
PCT Pub. Date: Jun. 3, 2021

(65) Prior Publication Data
US 2023/0006124 A1     Jan. 5, 2023

(30) Foreign Application Priority Data
Nov. 26, 2019    (JP) .................................. 2019-212985

(51) Int. Cl.
*H01L 41/047*          (2006.01)
*H01L 41/053*          (2006.01)
(Continued)

(52) U.S. Cl.
CPC ........... *H10N 30/87* (2023.02); *H10N 30/088* (2023.02); *H10N 30/09* (2023.02); *H10N 30/30* (2023.02); *H10N 30/88* (2023.02)

(58) Field of Classification Search
CPC ...... H10N 30/87; H10N 30/088; H10N 30/09; H10N 30/30; H10N 30/88; H03H 9/02023;
(Continued)

(56) References Cited

U.S. PATENT DOCUMENTS 8,963,402 B2 *   2/2015   Kusano .............. H03H 9/02133
310/353

FOREIGN PATENT DOCUMENTS

CN          102571024  A        7/2012
JP         2012-119856  A        6/2012
(Continued)

OTHER PUBLICATIONS

JP2018056860A English Translation (Year: 2025).*

*Primary Examiner* — Dominick L Plakkoottam
(74) *Attorney, Agent, or Firm* — Volpe Koenig

(57) ABSTRACT

A crystal element includes a vibration part, a holding part, an electrode part, and a recess that corresponds to a recess and/or protrusion. The vibration part has a pair of vibration-part main surfaces. The holding part is formed integrally with the vibration part to be connected to an outer edge of vibration part and has a pair of holding-part main surfaces and holding-part side surfaces. The electrode part is provided at the vibration-part main surfaces. The recess is located at the holding-part side surfaces.

14 Claims, 7 Drawing Sheets

(51) Int. Cl.

| | | |
|---|---|---|
| *H01L 41/113* | (2006.01) | |
| *H01L 41/338* | (2013.01) | |
| *H01L 41/35* | (2013.01) | |
| *H10N 30/088* | (2023.01) | |
| *H10N 30/09* | (2023.01) | |
| *H10N 30/30* | (2023.01) | |
| *H10N 30/87* | (2023.01) | |
| *H10N 30/88* | (2023.01) | |

(58) Field of Classification Search

CPC ............. H03H 9/02062; H03H 9/0519; H03H 9/1021; H03H 9/19

See application file for complete search history.

(56) References Cited

FOREIGN PATENT DOCUMENTS

| | | | |
|---|---|---|---|
| JP | 2016-139901 A | | 8/2016 |
| JP | 2018056860 A | * | 4/2018 |
| JP | 2018056861 A | * | 4/2018 |
| JP | 2018-164193 A | | 10/2018 |
| WO | 2006/114936 A1 | | 11/2006 |

* cited by examiner

71

60

72

60

CRYSTAL ELEMENT, CRYSTAL DEVICE, ELECTRONIC EQUIPMENT, AND METHOD FOR MANUFACTURING CRYSTAL ELEMENT

TECHNICAL FIELD

The present disclosure relates to a crystal element, a crystal device including the crystal element, electronic equipment including the crystal device, and a method for manufacturing the crystal element. Examples of crystal devices include crystal resonators and crystal oscillators.

BACKGROUND ART

A crystal element having a thickness-shear vibration mode includes an AT-cut crystal piece having main surfaces and excitation electrodes of metal film patterns formed on both of the main surfaces. The crystal device utilizes the piezoelectric effect and the inverse piezoelectric effect of the crystal element to generate a specified oscillation frequency. A typical crystal device has a structure in which a crystal element is contained in a package and hermetically encapsulated within by a lid (for example, see Japanese Unexamined Patent Application Publication No. 2016-139901).

SUMMARY OF INVENTION

A crystal element according to the present disclosure includes:
- a vibration part having a pair of vibration-part main surfaces;
- a holding part formed integrally with the vibration part to be connected to an outer edge of the vibration part and having a pair of holding-part main surfaces and a holding-part side surface;
- an electrode part provided at the vibration-part main surfaces; and
- a recess and/or protrusion at the holding-part side surface.

A crystal device according to the present disclosure includes the crystal element according to the present disclosure, and electronic equipment according to the present disclosure includes the crystal device according to the present disclosure.

A method for manufacturing the crystal element according to the present disclosure is a method for manufacturing the crystal element according to the present disclosure by wet etching, and the method includes the following first to third steps, based on a Cartesian coordinate system XY'Z' including an X-axis, a Y'-axis, and a Z'-axis, defined by rotating a Cartesian coordinate system XYZ including the X-axis, a Y-axis, and a Z-axis of crystal axes of crystal, around the X-axis by 30° or more and 50° or less.

A first step of preparing a crystal wafer having two wafer main surfaces parallel to an XZ' plane and having a relationship of front and back, and forming a mask of corrosion-resistant film on the two wafer main surfaces.

A second step of immersing the crystal wafer with the mask formed thereon in etchant to form a crystal piece in the crystal wafer, the crystal piece including the vibration part, the holding part, and the recess and/or protrusion.

A third step of removing the mask from the crystal wafer with the crystal piece formed therein.

Then, in the first step, the mask is formed such that the mask that protects a portion that serves as a holding-part main surface of the pair of holding-part main surfaces on a positive side of the Y'-axis is shifted in a positive direction of the Z'-axis relative to the mask that protects a portion that serves as a holding-part main surface of the pair of holding-part main surfaces on a negative side of the Y'-axis.

DESCRIPTION OF EMBODIMENTS

Figure 1:
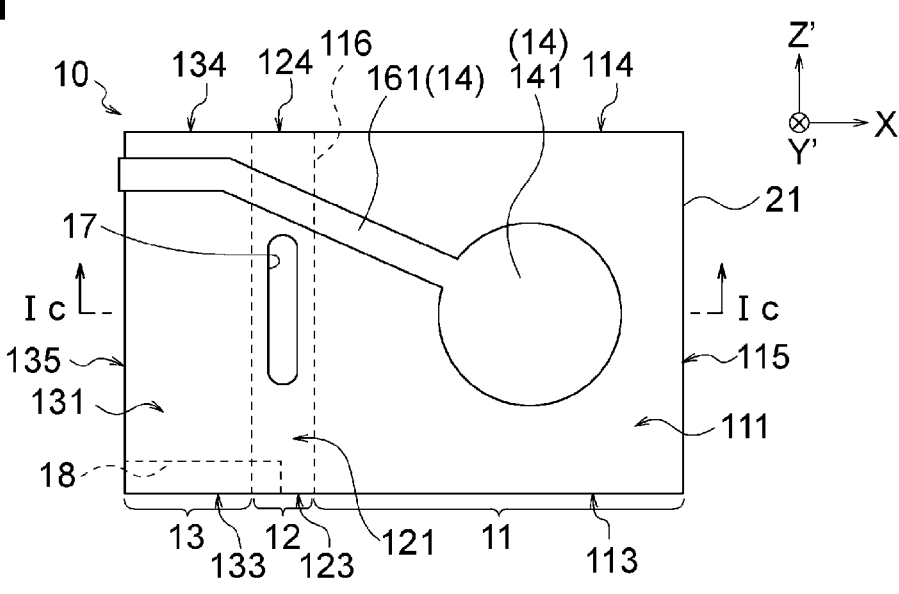
FIG. 1 is a plan view of a crystal element of a first embodiment.

In a crystal element, when an alternating voltage is applied to the excitation electrodes, thickness-shear vibration occurs in a portion of the crystal piece between the excitation electrodes. At this time, in addition to the thickness-shear vibration, bending vibration and contour vibration occur as secondary vibration. This secondary vibration occurs not only in the part between the excitation electrodes but in the entire crystal piece and tends to be combined with the thickness-shear vibration, which is the primary vibration. When the thickness-shear vibration and the secondary vibration are combined, the state of vibration changes, and there is a possibility of deterioration in electrical characteristics, such as an increase in the equivalent series resistance value of the crystal element.

A crystal element according to the present disclosure has a recess and/or protrusion at a holding-part side surface of a holding part and thereby reduces deterioration in electrical characteristics caused by the secondary vibration.

Hereinafter, with reference to the attached drawings, configurations for implementing the present disclosure (which are hereinafter denoted as "embodiments") will be described. Note that in the present specification and the drawings, substantially the same constituents are denoted by the same symbols, and description thereof is omitted as appropriate. The shapes in the drawings are depicted to enable easier understanding for those skilled in the art; hence they do not necessarily correspond to actual dimensions and ratios. For example, an actual etched surface of crystal has a complex shape because of unique anisotropic etching, but an etched surface here is depicted as a simple one, except in FIGS. 5 to 7.

First Embodiment

Figure 2:
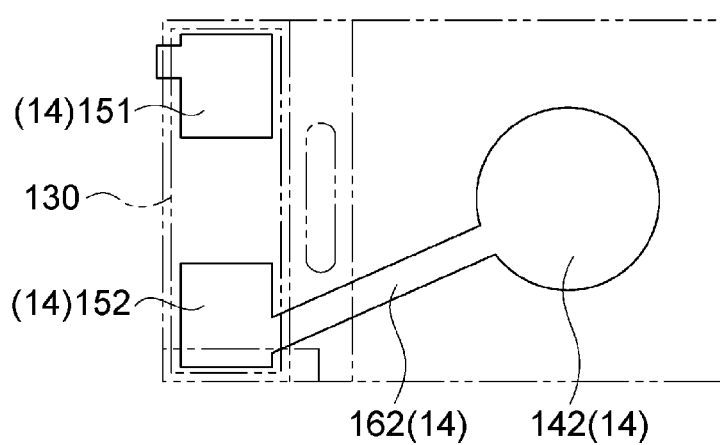
FIG. 2 is a view seen through the back side of the crystal element in FIG. 1.
Figure 3:
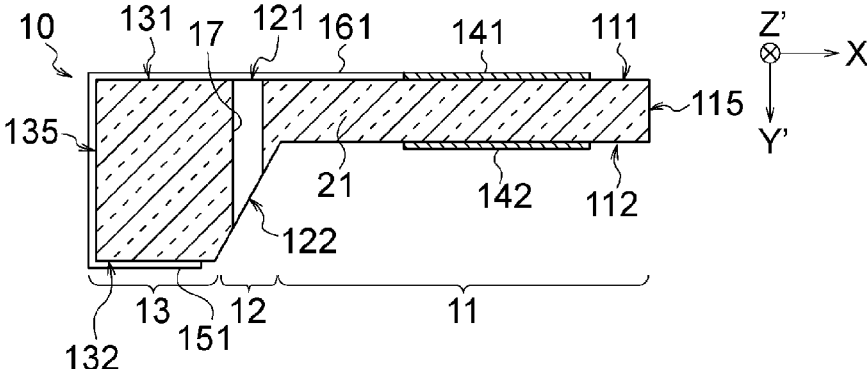
FIG. 3 is a sectional view taken along line Ic-Ic in FIG. 1.
Figure 4:
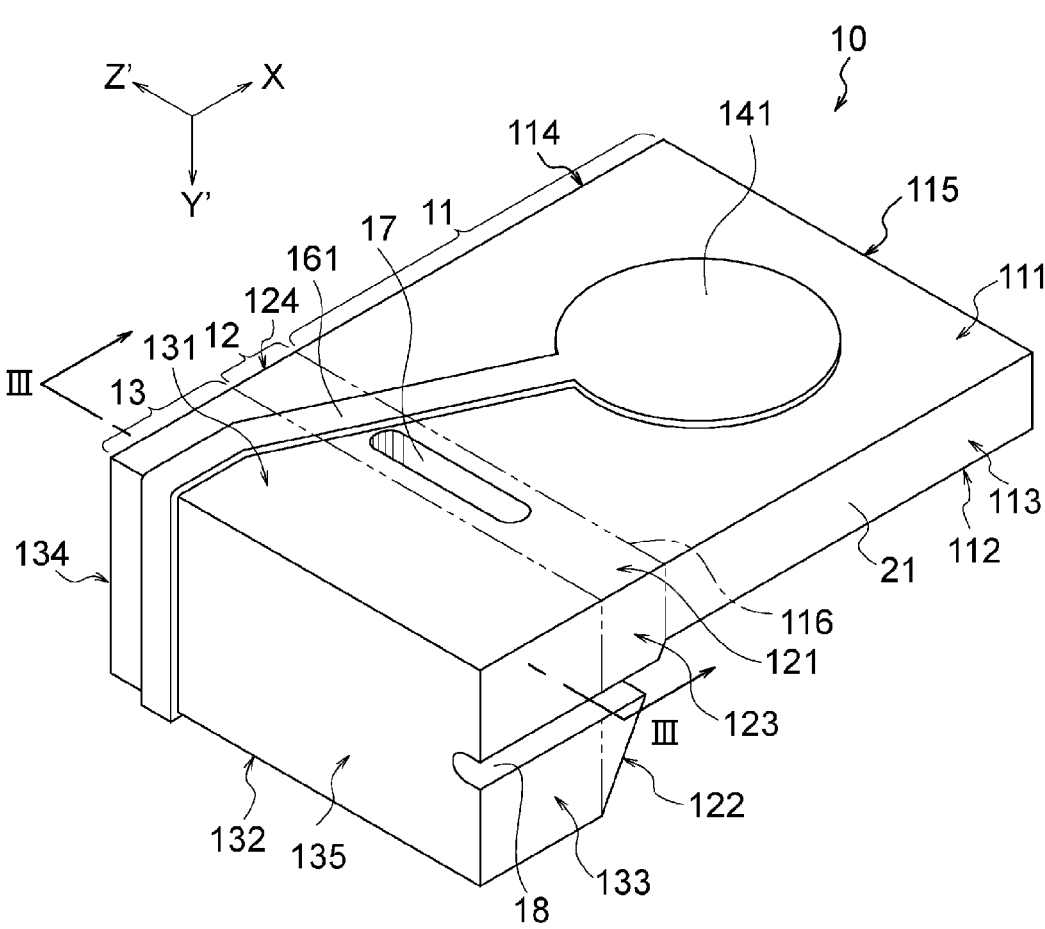
FIG. 4 is a perspective view of the crystal element of the first embodiment.
Figure 5:
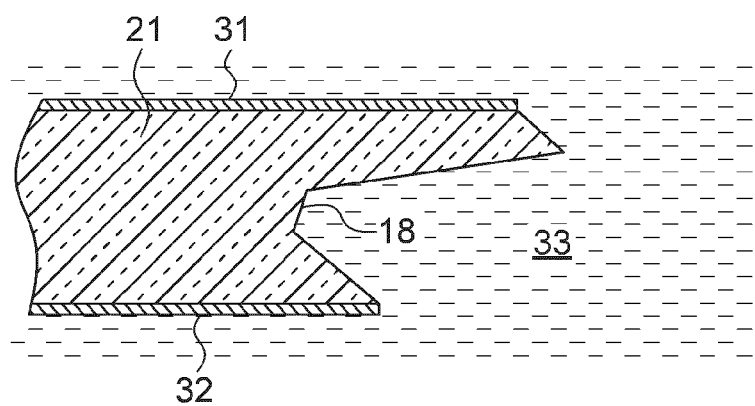
FIG. 5 is a sectional view of a portion corresponding to the cross section taken along line III-III in FIG. 4 and shows a first step for forming a recess.
Figure 6:
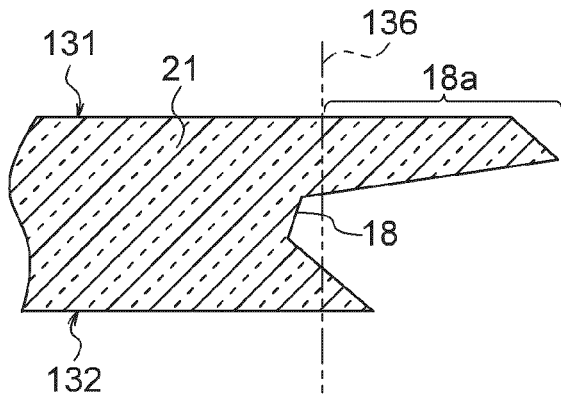
FIG. 6 is a sectional view of the portion corresponding to the cross section taken along line III-III in FIG. 4 and shows a second step for forming the recess.
Figure 7:
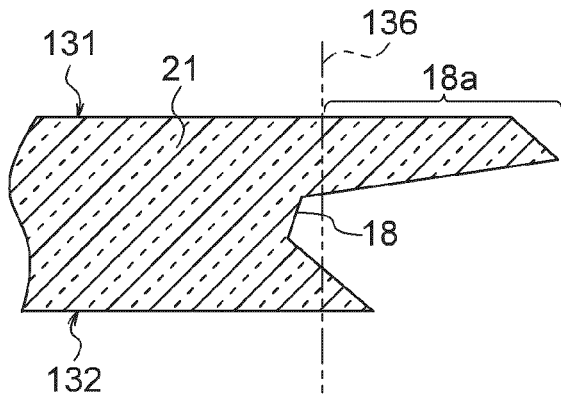
FIG. 7 is a sectional view of the portion corresponding to the cross section taken along line III-III in FIG. 4 and shows a third step for forming the recess.

FIG. 1 is a plan view of a crystal element of a first embodiment, FIG. 2 is a view seen through the back side of the crystal element in FIG. 1, and FIG. 3 is a sectional view taken along line Ic-Ic in FIG. 1. FIG. 4 is a perspective view of the crystal element of the first embodiment. FIGS. 5 to 7 are sectional views of a portion corresponding to the cross section taken along line III-III in FIG. 4, and the steps for forming a recess progress in the order of FIG. 5 (the first step), FIG. 6 (the second step), and FIG. 7 (the third step). The following description is made based on these drawings.

The first embodiment relates to a crystal element. A pair of surfaces having a relationship of front and back are denoted as "main surfaces", the surfaces between the pair of main surfaces are denoted as "side surfaces", and dimensions in the direction perpendicular to the main surfaces are denoted as "thickness". In addition, the Cartesian coordinate system XYZ including the crystal axes of the crystal, the X-axis, the Y-axis, and the Z-axis, is rotated around the X-axis by 30° or more and 50° or less, and the resultant coordinate system is defined as a Cartesian coordinate system XY'Z' including the X-axis, the Y'-axis, and the Z'-axis. In each figure, the directions indicated by arrows of the X-axis, the Y'-axis, and the Z'-axis are positive (+) directions, and opposite directions are negative (−) directions.

A crystal element 10 of the first embodiment includes a vibration part 11, a holding part 13, an electrode part 14, and a recess 18 which corresponds to a recess and/or protrusion. The vibration part 11 has a pair of vibration-part main surfaces 111 and 112. The holding part 13 is formed integrally with the vibration part 11 to be connected to an outer edge portion of the vibration part 11 and has a pair of holding-part main surfaces 131 and 132 and holding-part side surfaces 133, 134, and 135. The electrode part 14 is provided at the vibration-part main surfaces 111 and 112. The recess 18 is located at the holding-part side surfaces 133 and 135.

More specifically, the vibration part 11 has the pair of vibration-part main surfaces 111 and 112 in a planar shape and vibration-part side surfaces 113, 114, and 115 between the pair of vibration-part main surfaces 111 and 112. The holding part 13 has the pair of holding-part main surfaces 131 and 132 in a planar shape and the holding-part side surfaces 133, 134, and 135 between the pair of holding-part main surfaces 131 and 132 and holds an outer edge of the vibration part 11. The electrode part 14 is for applying a voltage to the vibration-part main surfaces 111 and 112 to cause the primary vibration in the vibration part 11. The recess 18 is located at the holding-part side surfaces 133 and 135 but not at the vibration-part side surfaces 113, 114, and 115 and reduces the secondary vibration that occurs along with the primary vibration.

The above constituents may have configurations as follows. The holding part 13 is thicker than the vibration part 11. The vibration part 11 is approximately quadrangular in plan view. The holding part 13 is located on at least one side 116 of the vibration part 11 in plan view. The holding part 13 has a fixing portion 130 (FIG. 2) including a portion configured to be in contact with a base 61 (described later) which corresponds to an element mounting member. The electrode part 14 has excitation electrodes 141 and 142 located on the vibration-part main surfaces 111 and 112, mounting electrodes 151 and 152 located on the fixing portion 130, and wiring electrodes 161 and 162 that electrically connect the excitation electrodes 141 and 142 to the mounting electrodes 151 and 152. The recess and/or protrusion correspond to the recess 18 recessed in the holding-part side surfaces 133 and 135.

In other words, the crystal element 10 includes the vibration part 11 having the vibration-part main surfaces 111 and 112 and the vibration-part side surfaces 113, 114, and 115 and being approximately quadrangular in plan view; the holding part 13 having the holding-part main surfaces 131 and 132 and the holding-part side surfaces 133, 134, and 135 and located on at least one side 116 of the vibration part 11 in plan view; the excitation electrodes 141 and 142 located on the vibration-part main surfaces 111 and 112; the mounting electrodes 151 and 152 located on at least one of the holding-part main surfaces 131 and 132; the wiring electrodes 161 and 162 electrically connecting the excitation electrodes 141 and 142 to the mounting electrodes 151 and 152; and the recess 18 located at the holding-part side surfaces 133 and 135 but not at the vibration-part side surfaces 113, 114, and 115 and corresponding to a recess and/or protrusion.

The planar shape of the vibration part 11 is not limited to an approximately quadrangular one and may be an approximately circular shape, an approximately elliptical shape, or the like. Examples of an "approximately quadrangular shape" include a square, a rectangle (an oblong), and a rectangular shape with four round corners.

Figure 14:
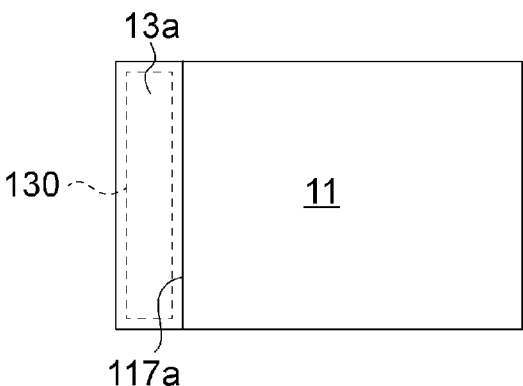
FIG. 14 is a schematic plan view of a first example of a holding part in the first embodiment.
Figure 15:
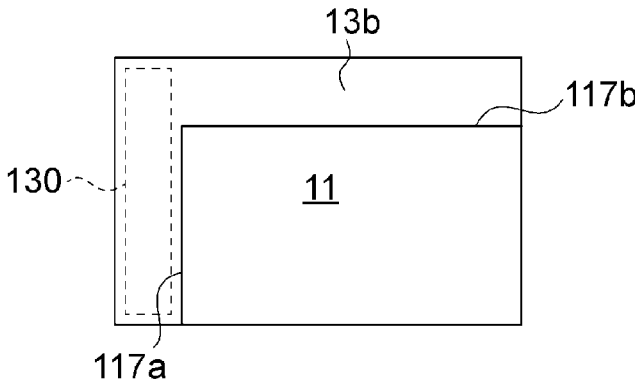
FIG. 15 is a schematic plan view of a second example of a holding part in the first embodiment.
Figure 16:
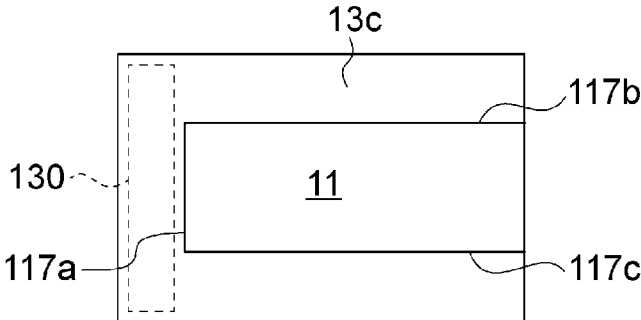
FIG. 16 is a schematic plan view of a third example of a holding part in the first embodiment.
Figure 17:
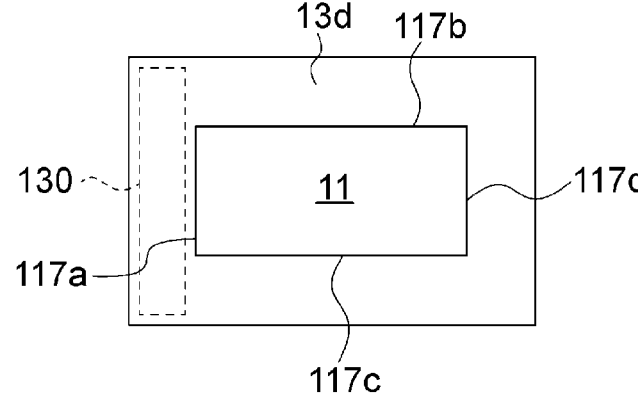
FIG. 17 is a schematic plan view of a fourth example of a holding part in the first embodiment.

In the first embodiment, the mounting electrodes 151 and 152 are located on the holding-part main surface 132 which is the fixing portion 130. Alternatively, the holding part 13 may be located, instead of only on one side 116 of the vibration part 11, on two sides or three sides of the vibration part 11, or the holding part 13 may surround all sides of the vibration part 11. Specific examples of these will be described based on FIGS. 14 to 17. A holding part 13a of a first example illustrated in FIG. 14 has an approximately I-shaped planar shape as in the first embodiment and is located on a first side 117a of the vibration part 11. A holding part 13b of a second example illustrated in FIG. 15 has an approximately L-shaped planar shape and is located on the first side 117a and a second side 117b of the vibration part 11. A holding part 13c of a third example illustrated in FIG. 16 has an approximately U-shaped planar shape and is located on the first side 117a side, the second side 117b, and a third side 117c of the vibration part 11. A holding part 13d of a fourth example illustrated in FIG. 17 has an approximately frame-like shaped planar shape and is located on the first side 117a, the second side 117b, the third side 117c, and a fourth side 117d of the vibration part 11. The thickness of the holding parts 13a, 13b, 13c, and 13d may differ from the thickness of the vibration part 11. For example, it may be greater than the thickness of the vibration part 11 (what is called an inverted-mesa type) or may be less than the thickness of the vibration part 11 (what is called a mesa type). The positions at which all of the fixing portions 130 of the holding parts 13a, 13b, 13c, and 13d are located are the same but may differ. In other words, the fixing portion 130 may be located at any position in the holding parts 13a, 13b, 13c, and 13d.

The recess 18 is in the form of a groove recessed in the holding-part side surfaces 133 and 135 and extends in the holding-part side surface 133 in the longitudinal direction of the crystal element 10. The dimension of the recess 18 in the Z'-axis direction (the depth of the groove) does not have to be constant. For example, the depth may increase as the position approaches the holding-part side surface 135. The position of the recess 18 may be on the holding-part side surface 134 side. Instead of the recess 18, the "recess and/or protrusion" may be, for example, a protrusion, a recess and a protrusion, or the like and is formed by, for example, wet etching, laser processing, ion beam processing, or the like, but without limitations on the number, the positions, and the shapes.

The vibration-part main surface 111 and the holding-part main surface 131 are on the same plane, and the holding part 13 is thicker than the vibration part 11. The holding part 13 has the two holding-part side surfaces 133 and 134 extending along the XY' plane and the one holding-part side surface 135 extending along the Y'Z' plane. The recess 18 is located in a portion from the holding-part side surface 133 to the holding-part side surface 135. In this case, the recess 18 can be formed by wet etching as described later.

In the first embodiment, the crystal element 10 has an inclined part 12 located between the vibration part 11 and the holding part 13 and having inclined-part main surfaces 121 and 122 and inclined-part side surfaces 123 and 124. The inclined-part main surface 121 is on the same plane as the vibration-part main surface 111 and the holding-part main surface 131, and the inclined-part main surface 122 is a slope connecting the vibration-part main surface 112 and the holding-part main surface 132. The inclined part 12 has a through hole 17 passing through the inclined-part main surfaces 121 and 122 in the thickness direction. The inclined-part main surface 122 can be formed by wet etching, when setting the crystal axes of a crystal piece 21 as illustrated in the figures. Note that the inclined-part side surface 123 may also include the recess and/or protrusion (the recess 18).

Next, a description will be given of an overview of a method for manufacturing the crystal element 10 by wet etching, as a manufacturing method of the first embodiment. The manufacturing method in the first embodiment includes the following first to third steps.

The first step: A crystal wafer 20 that has two wafer main surfaces 201 and 202 parallel to the XZ' plane and having a relationship of front and back is prepared, and masks 31 and 32 of a corrosion-resistant film are formed on the two wafer main surfaces 201 and 202 (FIG. 5).

The second step: The crystal wafer 20 with the masks 31 and 32 formed thereon is immersed in etchant 33 to form a crystal piece 21 including the vibration part 11, the holding part 13, and the recess and/or protrusion (the recess 18) in the crystal wafer 20 (FIGS. 4 and 6).

The third step: The masks 31 and 32 are removed from the crystal wafer 20 with the crystal piece 21 formed therein (FIG. 7).

In the first step, the masks 31 and 32 are formed such that the mask 32 which protects the portion that serves as the holding-part main surface 132 on the positive side of the Y'-axis is shifted in the positive direction of the Z'-axis relative to the mask 31 which protects the portion that serves as the holding-part main surface 131 on the negative side of the Y'-axis.

With the manufacturing method in the first embodiment, it is possible to form the recess 18 easily in the wet etching to form the crystal piece 21 by shifting one mask 32 of the masks, which protect the holding part 13, in the Z'-axis direction relative to the other mask 31. Thus, not only is it possible to manufacture the crystal element 10 that provides the operation and effects described later, but it is also possible to form the recess 18 at the same time that the crystal piece 21 is formed. Thus, since a dedicated step is not necessary to form the recess 18, the manufacturing step can be simplified.

In the case where the thickness t of the crystal wafer 20 in the Y'-axis direction is 30 μm or more and 50 μm or less, the mask 31 and mask 32 may be formed in the first step such that the mask 32 which protects the portion that serves as the holding-part main surface 132 on the positive side of the Y'-axis is shifted in the positive direction of the Z'-axis by 10 μm or more and 20 μm or less relative to the mask 31 which protects the portion that serves as the holding-part main surface 131 on the negative side of the Y'-axis. In this case, if the shift distance is less than 10 μm or more than 20 μm, adjacent holding parts 13 tend to be connected to each other via a protrusion 18a, and it would take time to separate the holding parts 13. Hence, the shift distance is set to 10 μm or more and 20 μm or less to make it easier to separate the thick holding parts 13.

In addition, for the crystal wafer 20 with the crystal piece 21 formed therein, the manufacturing method may further include a step of cutting part of the portion that serves as the recess and/or protrusion (the recess 18) along a plane 136 parallel to the XY' plane. In this case, it is possible to remove the protrusions 18a and leave only the recess 18.

Next, a detailed description of a case of forming the recess 18 by wet etching will be further given.

First, as illustrated in FIG. 5, the masks 31 and 32 are formed on the crystal wafer 20 to form the outer shape of the crystal piece 21. The crystal wafer 20 is an AT cut plate, and the masks 31 and 32 are corrosion-resistant film containing chromium (Cr) or the like. In this process, the crystal axes of the crystal wafer 20 are set as illustrated in the figure, and the mask 32 that protects the holding-part main surface 132 is shifted in the Z'-axis direction by an offset Δz relative to the mask 31 that protects the holding-part main surface 131. For example, in the case where the thickness of the holding part 13 is 30 to 50 μm, the offset Δz is 10 to 20

Next, as illustrated in FIG. 6, the crystal wafer 20 with the masks 31 and 32 formed thereon is immersed in the etchant 33 containing hydrofluoric acid or the like. Then, the portions of the crystal wafer 20 not covered with the masks 31 and 32 are gradually removed, and the recess 18 having a unique three-dimensional shape appears in the crystal piece 21. This is due to the anisotropic etching of crystal with an increasing etching rate in the order of the Y-axis, the X-axis, and the Z-axis.

Lastly, as illustrated in FIG. 7, the masks 31 and 32 are removed to obtain the outer shape of the crystal piece 21 and the recess 18 at the same time. The recess 18 illustrated in FIG. 7 can be used as is, or the recess 18 may be cut along the plane 136 parallel to the XY' plane to obtain the holding-part side surface 133 parallel to the XY' plane. Note that in the case of using the recess 18 illustrated in FIG. 7 as is, the protrusion 18a formed together with the recess 18 is an example of a protrusion in "recess and/or protrusion".

Next, the constituents of the crystal element 10 will be further described in detail.

The crystal element 10 operates in a thickness-shear vibration mode, and the oscillation frequency (the fundamental frequency) is, for example, 150 MHz or more. The vibration part 11, the inclined part 12, and the holding part 13 are composed of one crystal piece 21. The excitation electrodes 141 and 142, the mounting electrodes 151 and 152, and the wiring electrodes 161 and 162 are metal patterns composed of the same material.

The crystal piece 21 is an AT cut crystal plate. Specifically, defining the Cartesian coordinate system XY'Z' in crystal by rotating the Cartesian coordinate system XYZ including the X-axis (the electrical axis), the Y-axis (the mechanical axis), and the Z-axis (the optical axis), around the X-axis by 30° or more and 50° or less (for example, 35° 15'), a wafer cut out parallel to the XZ' plane is used as a raw material of the crystal piece 21. The longitudinal direction of the crystal piece 21 is parallel to the X-axis, the lateral direction to the Z'-axis, and the thickness direction to the Y'-axis.

Below is an example of the dimensions of the crystal piece 21 and the like. The crystal piece 21 has a length (in the X-axis direction) of 750 to 950 μm and a width (in the Z'-axis direction) of 600 to 800 μm. The holding part 13 has a thickness (in the Y'-axis direction) of 30 to 50 μm, the vibration part 11 has a thickness (in the Y'-axis direction) of approximately 6.8 μm, and the excitation electrodes 141 and 142 have diameters of 250 to 400 μm. In this case, the oscillation frequency is approximately 245 MHz.

The inclined-part main surface 121 is on the same plane as the vibration-part main surface 111 and the holding-part main surface 131, but the inclined-part main surface 122 is a slope connecting the vibration-part main surface 112 and the holding-part main surface 132. In other words, the thickness of the inclined part 12 decreases as the distance from the holding part 13 increases. Thus, the stress transmitted from the holding part to the vibration part 11 is absorbed or dispersed by the inclined part 12 (a gentle step). In addition, the secondary vibration generated at the vibration part 11 is gradually attenuated as it approaches the holding part 13, and the influence of the secondary vibration on the vibration part 11 reflected by the holding part 13 reduces. Thus, the inclined part 12 plays, among other roles, a role of reducing the equivalent series resistance value.

The through hole 17 passes through between the mounting electrodes 151 and 152 and the vibration part 11 in the thickness direction. With this, the stress transmitted from the holding part 13 to the vibration part 11 is absorbed or dispersed by the through hole 17. In other words, the through hole 17 reduces the strain generated in the vibration part 11 when the holding part 13 is connected to the package. In addition, the through hole 17 plays a role of confining the vibration energy of the vibration part 11. Thus, the through hole 17 plays, among other roles, a role of reducing the equivalent series resistance value. In addition, because the through hole 17 is formed in the inclined part 12, these effects are enhanced by being combined with the effects of the inclined part 12.

The pair of excitation electrodes 141 and 142 are approximately circular in plan view and respectively provided approximately at the centers of the vibration-part main surfaces 111 and 112 of the vibration part 11. From the excitation electrodes 141 and 142, the wiring electrodes 161 and 162, which do not contribute to the excitation but are for connection, extend to the mounting electrodes 151 and 152. In other words, the excitation electrode 141 is electrically continuous with the mounting electrode 151 via the wiring electrode 161, and the excitation electrode 142 is electrically continuous with the mounting electrode 152 via the wiring electrode 162.

Note that the shapes of the excitation electrodes 141 and 142 are not limited to approximately circular ones and may be, for example, approximately elliptical ones, approximately quadrangular ones, or the like. The wiring electrodes 161 and 162 may be made wider than the ones in the figures to reduce the equivalent series resistance value. Although the mounting electrodes 151 and 152 are both located on the holding-part main surface 132, a configuration in which at least one of them is located on the holding-part main surface 131 is possible. In this case, wiring may be used to electrically connect the mounting electrodes 151 and 152 to the package or the like.

The metal patterns forming the excitation electrodes 141 and 142 and others are, for example, laminates including a primary layer of chromium (Cr) and a conductor layer of gold (Au). Specifically, the primary layer is on the crystal piece 21, and the conductor layer is on the primary layer. The primary layer plays mainly a role of providing a force for adhering to the crystal piece 21. The conductor layer plays mainly a role of providing electrical conduction.

Hereinafter, formation of a metal film is called film formation. Examples of manufacturing steps of metal patterns include a method including forming photoresist patterns after film formation on a crystal piece, and performing etching on the resultant; a method including forming photoresist patterns on a crystal piece, and performing film formation and a lift-off process on the resultant; and a method including covering a crystal piece with metal masks, and performing film formation on the resultant. Film formation is performed by using sputtering, vapor deposition, or the like.

The crystal element 10 can be manufactured, for example, by using a photolithography technique and an etching technique, as follows.

First, corrosion-resistant films are formed on the entire surfaces of an AT-cut crystal wafer, and photoresists are then formed on the corrosion-resistant films. Next, masks having patterns of the outer shape of the crystal piece 21 (including the through hole 17) and the vibration part 11 (only for one side) are laid on the photoresists, and parts of the corrosion-resistant films are exposed by exposure and development. Then, wet etching is performed on the corrosion-resistant films in this state. Next, by using the remaining corrosion-resistant films as masks, wet etching is performed on the crystal wafer to form the outer shape of the crystal piece 21 and the vibration part 11. The outer shape of the crystal piece 21 is formed by double-sided etching, and the vibration part 11 is formed by single-sided etching. The inclined-part main surface 122 is also formed in this wet etching.

In this step, as described earlier, one mask of the masks on both sides is shifted in the Z'-axis direction relative to the other mask so that the recess 18 illustrated in FIG. 6 can be obtained at the same time. Note that because the vibration-part main surface 112 is not covered with a mask, the recess 18 is not formed at the vibration part 11.

Next, the remaining corrosion-resistant films are removed from the crystal wafer, and metal films serving as the excitation electrodes 141 and 142 and others are provided on the entire surfaces of the crystal wafer. Next, photoresist masks having patterns of the excitation electrodes 141 and 142 and others are formed on the metal films, and unnecessary metal films are removed by etching to form the excitation electrodes 141 and 142 and others. Next, by removing unnecessary photoresists, a plurality of crystal elements 10 are formed in the crystal wafer. Lastly, the individual crystal elements 10 are separated from this crystal wafer to obtain discrete crystal elements 10.

The crystal element 10 operates as follows. An alternating voltage is applied to the crystal piece 21 via the excitation electrodes 141 and 142. Then, thickness-shear vibration occurs in the crystal piece 21 such that the vibration-part main surfaces 111 and 112 are displaced from each other, and this generates a specified oscillation frequency. In this way, the crystal element 10 operates to output a signal of a constant oscillation frequency by utilizing the piezoelectric effect and inverse piezoelectric effect of the crystal piece 21. In this operation, the thinner the crystal piece 21 between the excitation electrodes 141 and 142(specifically, the vibration part 11), the higher the generated oscillation frequency.

Next, the operation and effects of the crystal element 10 will be described.

(1) Since the crystal element 10 includes a recess and/or protrusion (the recess 18) located at the holding-part side surfaces 133 and 135 but not at the vibration-part side surfaces 113, 114, and 115, it is possible to reduce deterioration in electrical characteristics (such as an increase in the equivalent series resistance value) caused by the secondary vibration. The reason for this is as follows.

The vibration of the crystal element 10 includes thickness-shear vibration, which is the primary vibration, and contour vibration and bending vibration, which are secondary vibration. For the thickness-shear vibration, the portion between the excitation electrodes 141 and 142 is vibrating the most, but the vibration is propagated also in the portion not between the excitation electrodes 141 and 142 in the directions from the outer edges of the excitation electrodes 141 and 142 to the outer edges of the vibration part 11. For the contour vibration, which is one mode of the secondary vibration, the shape of the crystal piece 21, for example, the contour of the vibration part 11 in the vibration part 11 is deforming and vibrating. For the bending vibration, which is one mode of the secondary vibration, the shape of the crystal piece 21 is bending and vibrating, for example, in a direction parallel to the X-axis or in a direction parallel to the Z'-axis in the vibration part 11. This secondary vibration occurs not only in the portion between the excitation electrodes 141 and 142 but in the entire crystal piece 21 and tends to be combined with the thickness-shear vibration, which is the primary vibration. When the thickness-shear vibration and the secondary vibration are combined, the state of vibration changes, and this can cause deterioration in electrical characteristics, such as an increase in the equivalent series resistance value of the crystal element 10.

In the crystal elements in the related art, the side surfaces of the fixing part and the side surfaces of the vibration part have the same shape. Since secondary vibration occurs in the entire crystal piece, the secondary vibration of the fixing part and the secondary vibration of the vibration part have similar states, such that the secondary vibration falls into a kind of resonance state and is unlikely to dissipate.

In contrast, since the crystal element 10 includes a recess and/or protrusion (the recess 18) located at the holding-part side surfaces 133 and 135 but not at the vibration-part side surfaces 113, 114, and 115, it is possible to partially change the length of the holding part 13 parallel to the Z'-axis. In addition, for example, by changing the depth of the recess 18 in the Z'-axis direction, it is possible to partially change the length of the holding part 13 parallel to the X-axis, also at edge portions of the sides parallel to the X-axis. Since bending vibration and contour vibration, which are secondary vibration, are dependent on the lengths of the portions that vibrate (for example, the length parallel to the X-axis and the length parallel to the Z'-axis), it is possible, by partially changing these lengths, to partially change the states of bending vibration and contour vibration, which are secondary vibration. Thus, the secondary vibration of the holding part 13 and the secondary vibration of the vibration part 11 are in different states, and the secondary vibration tends to attenuate. This in turn makes it possible to reduce deterioration in electrical characteristics caused by the secondary vibration.

(2) The "recess and/or protrusion" may be a recess 18 recessed in the holding-part side surfaces 133 and 135. In this case, when the crystal element 10 is mounted in a package with conductive adhesive as described later, the conductive adhesive enters the recess 18, increasing the area of adhesion of the conductive adhesive, and this improves the bonding strength of the crystal element 10.

(3) The vibration-part main surface 111 and the holding-part main surface 131 may be on the same plane, and the holding part 13 may be thicker than the vibration part 11. In this case, since the structure is one in which the thick holding part 13 supports the thin vibration part 11, even in the case where the vibration part 11 is thinner to achieve a higher oscillation frequency, it is possible to keep the mechanical strength of the crystal element 10. In addition, since the holding part 13 is sufficiently thick, it is easy to form the recess 18.

(4) The holding part 13 may have the two holding-part side surfaces 133 and 134 extending along the XY' plane and the one holding-part side surface 135 extending along the Y'Z' plane, and the recess 18 may be located in a portion from the holding-part side surface 133 (or the holding-part side surface 134) to the holding-part side surface 135. In this case, it is possible to form the recess 18 easily by shifting one of the masks that protect the holding part 13 in the Z'-axis direction relative to the other mask in the wet etching to form crystal piece 21. Since the recess 18 can be formed at the same time as forming the crystal piece 21, and since a dedicated step is not necessary to form the recess 18, the manufacturing step can be simplified.

Other Examples

Figure 8:
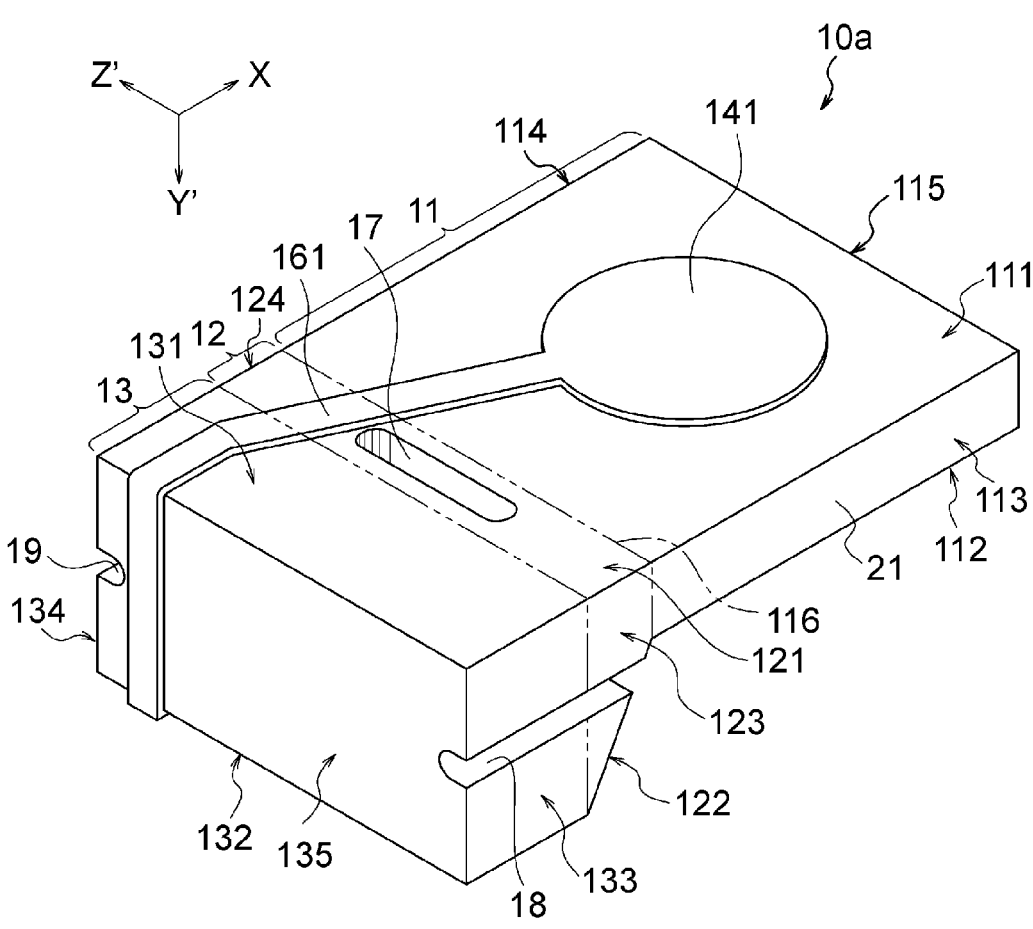
FIG. 8 is a perspective view of another example of a crystal element according to the first embodiment.

FIG. 8 is a perspective view of another example of a crystal element according to the first embodiment. Hereinafter, a description will be given based on this drawing.

The "recesses and/or protrusion" in a crystal element 10a of this example includes a first recess 18 located in a portion from the holding-part side surface 133 to the holding-part side surface 135 and a second recess 19 located in a portion from the holding-part side surface 134 to the holding-part side surface 135. The recess 19, as with the recess 18, has a groove shape recessed in the holding-part side surfaces 134 and 135 of the holding part 13 and extends in the longitudinal direction of the crystal element 10 in the holding-part side surface 134. The dimension of the recess 19 in the Z'-axis direction (the depth of the groove) does not have to be constant. For example, the depth may increase as the position approaches the holding-part side surface 135. Note that the inclined-part side surfaces 123 and 124 may also include the recess and/or protrusion (the recesses 18 and 19).

In the crystal element 10a, the recesses 18 and 19 at both of the holding-part side surfaces 133 and 134 further increase the difference between the secondary vibration of the holding part 13 and the secondary vibration of the vibration part 11. This makes it possible to further reduce deterioration in electrical characteristics caused by the secondary vibration. In addition, since the crystal element 10*a* has the recesses 18 and 19 at both of the holding-part side surfaces 133 and 134, it is possible to further improve the bonding strength to mount the crystal element 10*a* in a package with conductive adhesive. The other configuration, operation, and effects of this example are the same as those of the first embodiment.

Second Embodiment

Figure 9:
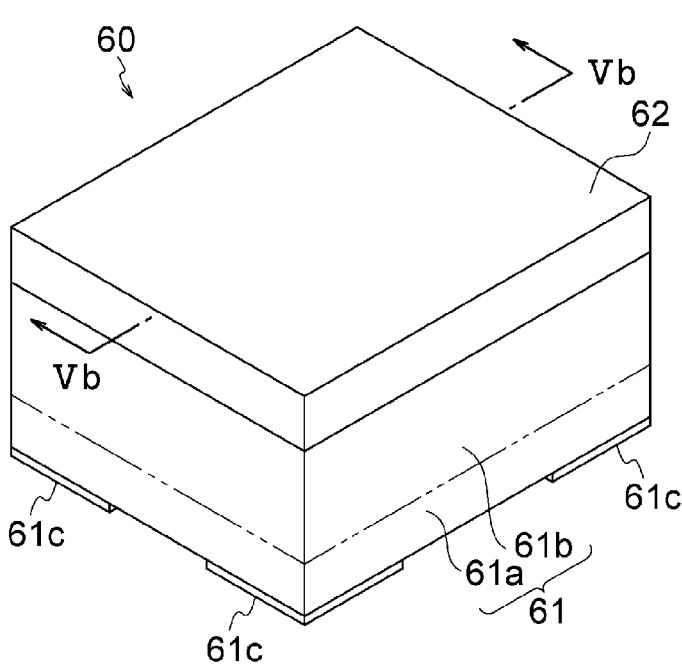
FIG. 9 is a perspective view of a crystal device according to a second embodiment.
Figure 10:
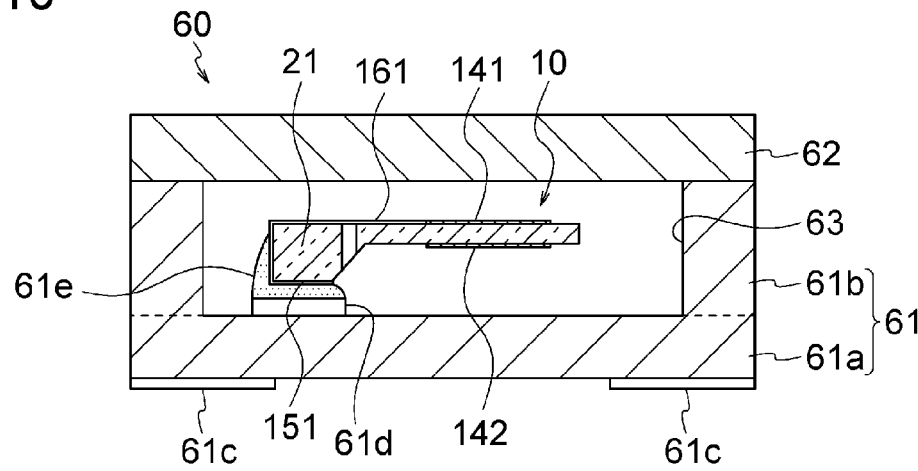
FIG. 10 is a sectional view taken along line Vb-Vb in FIG. 9.
Figure 11:
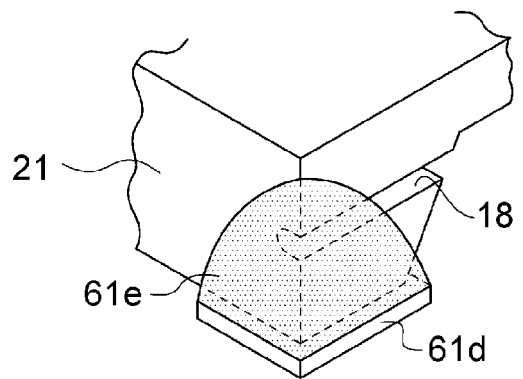
FIG. 11 is a perspective view of a portion of the crystal device according to the second embodiment.

FIG. 9 is a perspective view of a crystal device according to a second embodiment, FIG. 10 is a sectional view taken along line Vb-Vb in FIG. 9, and FIG. 11 is a perspective view of part of the crystal device according to the second embodiment. Hereinafter, a crystal device including the crystal element of the first embodiment will be described as a crystal device 60 of the second embodiment based on these figures.

As illustrated in FIGS. 9 and 10, the crystal device 60 of the second embodiment includes the crystal element 10 of the first embodiment, a base 61 in which the crystal element 10 is located, and a lid 62 that, together with the base 61, hermetically encapsulates the crystal element 10. The mounting electrodes 151 and 152 of the crystal element 10 are connected to the base 61 with conductive adhesive 61*e*. As illustrated in FIG. 11, the conductive adhesive 61*e* is also placed in the recess 18.

The base 61 is also called an element mounting member or a package and includes a substrate 61*a* and a frame 61*b*. The space surrounded by the upper surface of the substrate 61*a*, the inner side surfaces of the frame 61*b*, and the lower surface of the lid 62 serves as a containing portion 63 for the crystal element 10. The crystal element 10 outputs, for example, a reference signal used in electronic equipment or the like.

In other words, the crystal device 60 includes the substrate 61*a* having a pair of electrode pads 61*d* on its upper surface and four external terminals 61*c* on its lower surface, the frame 61*b* located to extend along the outer peripheral edges of the upper surface of the substrate 61*a*, the crystal element 10 mounted on the pair of electrode pads 61*d* via the conductive adhesive 61*e*, and the lid 62 that, together with the frame 61*b*, hermetically encapsulates the crystal element 10.

The substrate 61*a* and the frame 61*b* are made of, for example, a ceramic material such as an alumina ceramic or a glass ceramic and integrally formed into the base 61. The base 61 and the lid are approximately rectangular in plan view. The external terminals 61*c*, the electrode pads 61*d*, and the lid 62 are electrically connected via conductors formed inside or on a side surface of the base 61. More specifically, the external terminal 61*c* is located at each of the four corners of the lower surface of the substrate 61*a*. Two of the external terminals 61*c* are electrically connected to the crystal element 10, and the remaining two external terminals 61*c* are electrically connected to the lid 62. The external terminals 61*c* are to be mounted on a printed-circuit board or the like of electronic equipment or the like.

The crystal element 10, as described above, includes the crystal piece 21, the excitation electrode 141 formed on the upper surface of the crystal piece 21, and the excitation electrode 142 formed on the lower surface of the crystal piece 21. The crystal element 10 is joined to the electrode pads 61*d* via the conductive adhesive 61*e* and plays a role of oscillating to generate a reference signal for electronic equipment or the like by utilizing its stable mechanical vibration and piezoelectric effect.

The electrode pads 61*d*, which are for mounting the crystal element 10 on the base 61, are paired and adjoin each other along one side of the substrate 61*a*. The mounting electrodes 151 and 152 are respectively fixed to the pair of electrode pads 61*d* in a state where one end of the crystal element 10 is a fixed end and the other end of the crystal element 10 is a free end apart from the upper surface of the substrate 61*a*. Thus, the crystal element 10 is fixed to the substrate 61*a* with a cantilever structure.

The conductive adhesive 61*e* contains, for example, a binder such as a silicone resin and conductive powder added as conductive filler. The lid 62 is made of, for example, an alloy containing at least any of iron, nickel, or cobalt, and joined to the frame 61*b* by seam welding or the like to hermetically seal the containing portion 63 in a vacuum state or in a state filled with nitrogen gas or the like.

The crystal device 60 with the crystal element 10 provides stable electrical characteristics. In addition, entry of the conductive adhesive 61*e* into the recess 18 increases the area of adhesion of the conductive adhesive 61*e*, improving the bonding strength of the crystal element 10. Note that the crystal device 60 may include a crystal element 10*a* of another example, instead of the crystal element 10 of the first embodiment.

Third Embodiment

Figure 12:
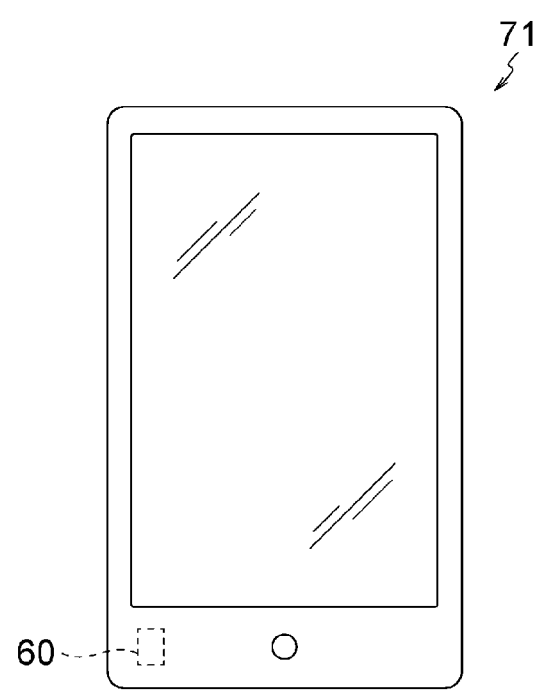
FIG. 12 is a front view of a first example of electronic equipment according to a third embodiment.
Figure 13:
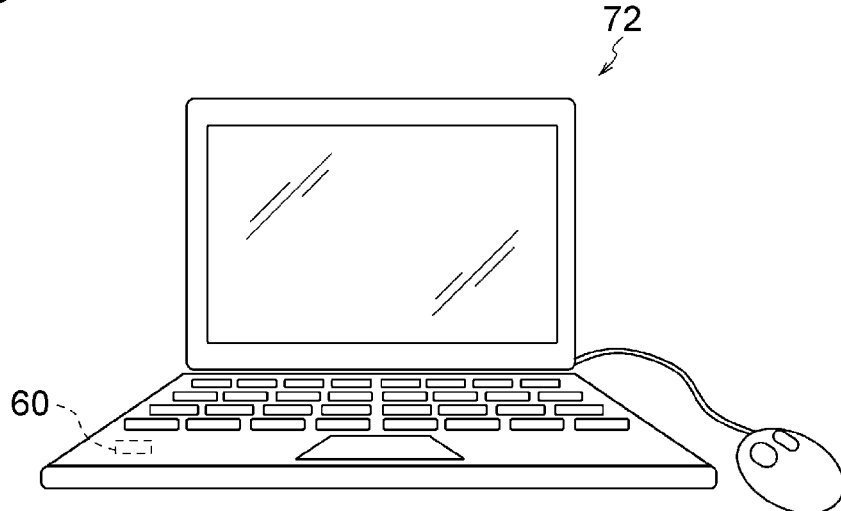
FIG. 13 is a front view of a second example of electronic equipment according to the third embodiment.

As illustrated in FIGS. 12 and 13, each piece of electronic equipment 71 and 72 of the third embodiment includes the crystal device 60. The electronic equipment 71 illustrated as an example in FIG. 12 is a smartphone, and the electronic equipment 72 illustrated as an example in FIG. 13 is a personal computer.

The crystal device 60 configured as illustrated in FIGS. 9 to 11 is mounted on a surface of a printed circuit board included in the electronic equipment 71 or 72 by the bottom surfaces of the external terminals 61*c* being fixed to the printed circuit board by soldering, or with gold (Au) bumps, conductive adhesive, or the like. Then, the crystal device 60 is used as an oscillation source, for example, in various kinds of electronic equipment, such as smartphones, personal computers, watches, game machines, communication units, and in-vehicle equipment, such as car navigation systems.

The electronic equipment 71 and 72 with the crystal device 60 can achieve high-performance and highly reliable operation based on the stable electrical characteristics.

Others

Although the present disclosure has been described above with reference to the above embodiments, the present disclosure is not limited thereto. The configuration and details of the present disclosure can be modified in various manners understood by those skilled in the art.

The present application claims the benefits of priority based on Japanese Patent Application Publication No. 2019-212985, filed on Nov. 26, 2019, and the entire contents of the disclosure are incorporated herein.

REFERENCE SIGNS LIST

10, 10*a* CRYSTAL ELEMENT
11 VIBRATION PART 111, 112 VIBRATION-PART MAIN SURFACE
113, 114, 115 VIBRATION-PART SIDE SURFACE
116 ONE SIDE
117a FIRST SIDE
117b SECOND SIDE
117c THIRD SIDE
117d FOURTH SIDE
12 INCLINED PART
121, 122 INCLINED-PART MAIN SURFACE
123, 124 INCLINED-PART SIDE SURFACE
13, 13a, 13b, 13c, 13d HOLDING PART
130 FIXING PORTION
131, 132 HOLDING-PART MAIN SURFACE
133, 134, 135 HOLDING-PART SIDE SURFACE
136 PLANE PARALLEL TO XY' PLANE
14 ELECTRODE PART
141, 142 EXCITATION ELECTRODE
151, 152 MOUNTING ELECTRODE
161, 162 WIRING ELECTRODE
17 THROUGH HOLE
18, 19 RECESS (RECESSES AND/OR PROTRU-SION)
18a PROTRUSION (RECESSES AND/OR PROTRU-SION)
20 CRYSTAL WAFER
201, 202 WAFER MAIN SURFACE
21 CRYSTAL PIECE
31, 32 MASK
33 ETCHANT
60 CRYSTAL DEVICE
61 BASE (ELEMENT MOUNTING MEMBER)
61a SUBSTRATE
61b FRAME
61c EXTERNAL TERMINAL
61d ELECTRODE PAD
61e CONDUCTIVE ADHESIVE
62 LID
63 CONTAINING PORTION
71, 72 ELECTRONIC EQUIPMENT

The invention claimed is:

1. A crystal element comprising:
a vibration part having a pair of vibration-part main surfaces;
a holding part formed integrally with the vibration part to be connected to an outer edge of the vibration part and having a pair of holding-part main surfaces and a holding-part side surface;
an electrode part provided at the vibration-part main surfaces; and
a recess and/or protrusion provided at the holding-part side surface, and is distal from and extends parallel to the pair of holding-part main surfaces so as to reduce a secondary vibration that occurs along with a primary vibration in the vibration part.

2. The crystal element according to claim 1, wherein the holding part is thicker than the vibration part.

3. The crystal element according to claim 2, wherein the vibration part is approximately quadrangular in plan view.

4. The crystal element according to claim 3, wherein the holding part is located on at least one side of the vibration part in plan view.

5. The crystal element according to claim 4, wherein the holding part has a fixing portion including a portion configured to be in contact with an element mounting member, and the electrode part has an excitation electrode located at the vibration-part main surfaces, a mounting electrode located in the fixing portion, and a wiring electrode that electrically connects the excitation electrode to the mounting electrode.

6. The crystal element according to claim 5, wherein one of the pair of vibration-part main surfaces and one of the pair of holding-part main surfaces are on a same plane.

7. The crystal element according to claim 6, wherein based on a Cartesian coordinate system XY'Z' including an X-axis, a Y'-axis, and a Z'-axis, defined by rotating a Cartesian coordinate system XYZ including the X-axis, a Y-axis, and a Z-axis of crystal axes of crystal, around the X-axis by 30° or more and 50° or less, the holding-part side surface of the holding part includes two holding-part side surfaces extending along an XY' plane and one holding-part side surface extending along a Y'Z' plane, and the recess and/or protrusion is located in a portion from at least one of the two holding-part side surfaces extending along the XY' plane to the one holding-part side surface extending along the Y'Z' plane.

8. The crystal element according to claim 7, wherein the recess and/or protrusion includes a first recess and/or protrusion located in a portion from one of the two holding-part side surfaces extending along the XY' plane to the one holding-part side surface extending along the Y'Z' plane and a second recess and/or protrusion located in a portion from an other of the two holding-part side surfaces extending along the XY' plane to the one holding-part side surface extending along the Y'Z' plane.

9. A crystal device comprising:
the crystal element according to claim 1;
an element mounting member at which the crystal element is located; and
a lid that, together with the element mounting member, hermetically encapsulates the crystal element.

10. The crystal device according to claim 9, wherein the holding part has an element mounting member, a mounting electrode of the crystal element is connected to the element mounting member with conductive adhesive, and the conductive adhesive is also placed inside a recess of the recess and/or protrusion.

11. Electronic equipment comprising the crystal device according to claim 9.

12. A method for manufacturing the crystal element according to claim 1 by wet etching, comprising:
based on a Cartesian coordinate system XY'Z' including an X-axis, a Y'-axis, and a Z'-axis, defined by rotating a Cartesian coordinate system XYZ including the X-axis, a Y-axis, and a Z-axis of crystal axes of crystal, around the X-axis by 30° or more and 50° or less,
a first step of preparing a crystal wafer having two wafer main surfaces parallel to an XZ' plane and having a relationship of front and back, and forming a mask of corrosion-resistant film on the two wafer main surfaces;
a second step of immersing the crystal wafer with the mask formed thereon in etchant to form a crystal piece in the crystal wafer, the crystal piece including the vibration part, the holding part, and the recess and/or protrusion; and
a third step of removing the mask from the crystal wafer with the crystal piece formed therein, wherein in the first step, the mask is formed such that the mask that protects a portion that serves as a holding-part main surface of the pair of holding-part main surfaces on a positive side of the Y'-axis is shifted in a positive direction of the Z'-axis relative to the mask that protects a portion that serves as a holding-part main surface of the pair of holding-part main surfaces on a negative side of the Y'-axis.

13. The method for manufacturing the crystal element, according to claim 12, wherein the crystal wafer has a thickness of 30 μm or more and 50 μm or less in a direction of the Y'-axis, and in the first step, the mask is formed such that the mask that protects the holding-part main surface on the positive side of the Y'-axis is shifted in the positive direction of the Z'-axis by 10 μm or more and 20 μm or less relative to the mask that protects the holding-part main surface on the negative side of the Y'-axis.

14. The method for manufacturing the crystal element, according to claim 12, further comprising a step of cutting part of a portion of the crystal wafer with the crystal piece formed therein along a plane parallel to an XY' plane, the portion serving as the recess and/or protrusion.

* * * * *